United States Patent
MacManus et al.

(10) Patent No.: US 12,525,757 B2
(45) Date of Patent: Jan. 13, 2026

(54) SPRING PIN RF COAXIAL INTERCONNECT

(71) Applicant: Rakuten Symphony, Inc., Tokyo (JP)

(72) Inventors: Gerard MacManus, Surrey (GB); Gareth Spiller, Surrey (GB)

(73) Assignee: Rakuten Symphony, Inc., Tokyo (JP)

( * ) Notice: Subject to any disclaimer, the term of this patent is extended or adjusted under 35 U.S.C. 154(b) by 170 days.

(21) Appl. No.: 18/018,751

(22) PCT Filed: Sep. 22, 2022

(86) PCT No.: PCT/US2022/044387
§ 371 (c)(1),
(2) Date: Jan. 30, 2023

(87) PCT Pub. No.: WO2023/229627
PCT Pub. Date: Nov. 30, 2023

(65) Prior Publication Data
US 2024/0258752 A1 Aug. 1, 2024

Related U.S. Application Data

(60) Provisional application No. 63/345,782, filed on May 25, 2022.

(51) Int. Cl.
*H01R 24/50* (2011.01)
*H01R 12/71* (2011.01)
*H01R 13/24* (2006.01)

(52) U.S. Cl.
CPC ........... *H01R 24/50* (2013.01); *H01R 12/714* (2013.01); *H01R 13/2421* (2013.01); *H01R 2201/02* (2013.01)

(58) Field of Classification Search
CPC .............. H01R 12/714; H01R 13/2421; H01R 2201/02; H01R 24/50
See application file for complete search history.

(56) References Cited

U.S. PATENT DOCUMENTS

| | | | | |
|---|---|---|---|---|
| 5,380,211 A | * | 1/1995 | Kawaguchi | ............ H01R 24/50 439/700 |
| 7,057,403 B2 | * | 6/2006 | Kazama | ............ G01R 1/06722 324/755.05 |

(Continued)

OTHER PUBLICATIONS

International Search Report and Written Opinion of the International Searching Authority issued by the United States Patent and Trademark Office for corresponding International Patent Application No. PCT/US2022/44387, electronically delivered on Jan. 6, 2023.

*Primary Examiner* — Abdullah A Riyami
*Assistant Examiner* — Thang H Nguyen
(74) *Attorney, Agent, or Firm* — Myers Wolin, LLC

(57) ABSTRACT

A coaxial connection assembly includes a first spring pin fixed to a first component to be connected, such as an antenna which may be a patch antenna. The assembly also includes a first contact on a circuit board for connecting to the first component by way of the first spring pin. The assembly also includes a front end module (FEM) cover for spacing apart the first component and the circuit board. The FEM cover defines a first channel through which the first spring pin extends. The FEM cover is formed from a conductive material, and the first channel contains a dielectric medium or substance.

11 Claims, 13 Drawing Sheets

(56) References Cited

U.S. PATENT DOCUMENTS

| | | | | |
|---|---|---|---|---|
| 7,371,128 | B2* | 5/2008 | DeLessert | G01R 1/0416 |
| | | | | 439/700 |
| 7,862,391 | B2* | 1/2011 | Johnston | H01R 13/2421 |
| | | | | 439/908 |
| 8,379,403 | B2* | 2/2013 | Waite | G01R 1/06772 |
| | | | | 257/726 |
| 8,758,066 | B2* | 6/2014 | Zhou | H01R 13/2435 |
| | | | | 439/700 |
| 2004/0095157 | A1* | 5/2004 | Sato | G01R 1/07371 |
| | | | | 324/756.01 |
| 2005/0079772 | A1* | 4/2005 | DeLessert | G01R 1/0416 |
| | | | | 439/700 |
| 2006/0066330 | A1* | 3/2006 | Yoshida | G01R 1/06772 |
| | | | | 324/756.03 |
| 2006/0066331 | A1* | 3/2006 | Yoshida | G01R 1/06772 |
| | | | | 324/756.03 |
| 2006/0094134 | A1* | 5/2006 | Yoshida | G01R 1/045 |
| | | | | 257/48 |
| 2007/0155231 | A1* | 7/2007 | Tang | H01R 24/547 |
| | | | | 439/578 |
| 2010/0244875 | A1* | 9/2010 | Chabineau-Lovgren | |
| | | | | H01R 12/714 |
| | | | | 324/755.11 |
| 2010/0255690 | A1* | 10/2010 | Waite | H05K 1/144 |
| | | | | 439/91 |
| 2013/0203298 | A1* | 8/2013 | Zhou | G01R 1/06722 |
| | | | | 439/700 |
| 2013/0281851 | A1* | 10/2013 | Carr | A61B 5/01 |
| | | | | 607/96 |
| 2023/0282978 | A1* | 9/2023 | Kim | H01Q 19/104 |
| | | | | 343/702 |
| 2024/0268073 | A1* | 8/2024 | MacManus | H05K 7/20336 |
| 2024/0377592 | A1* | 11/2024 | MacManus | G02B 6/3879 |

\* cited by examiner

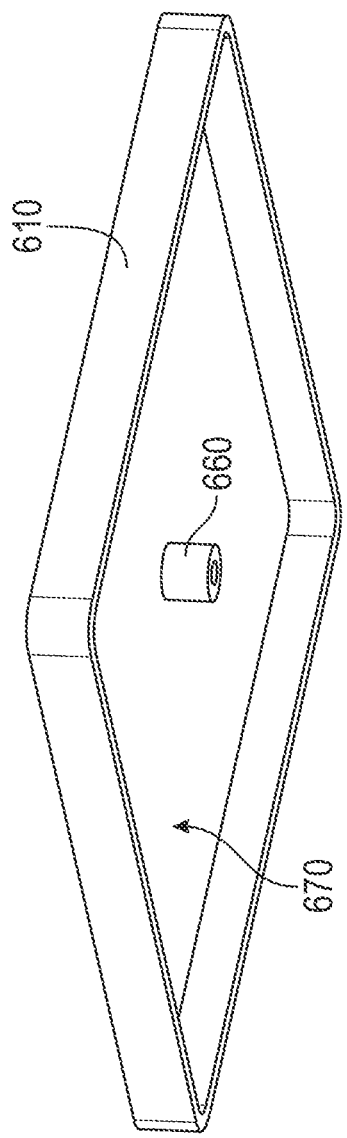
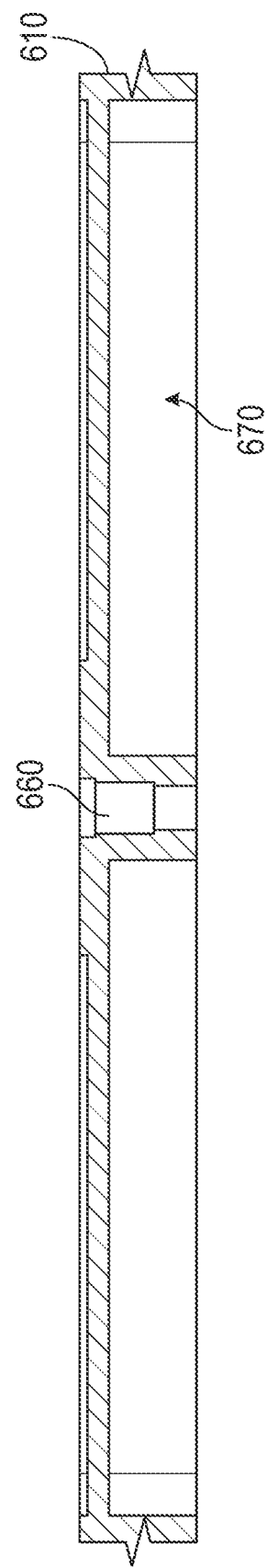

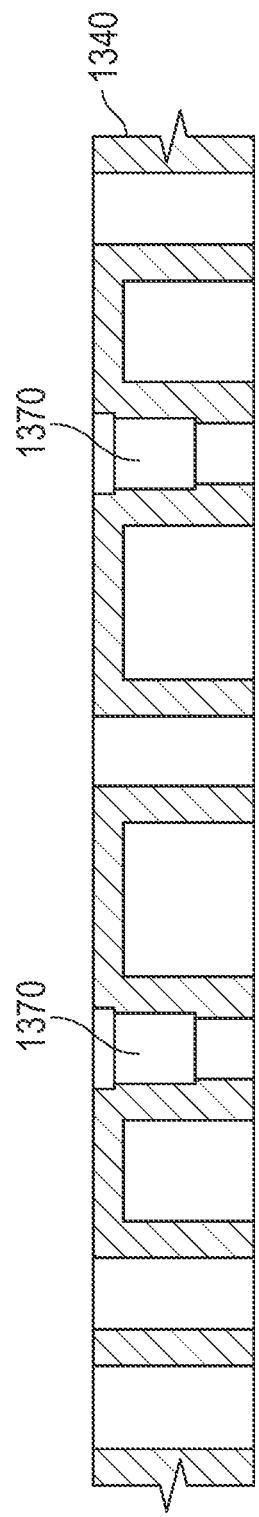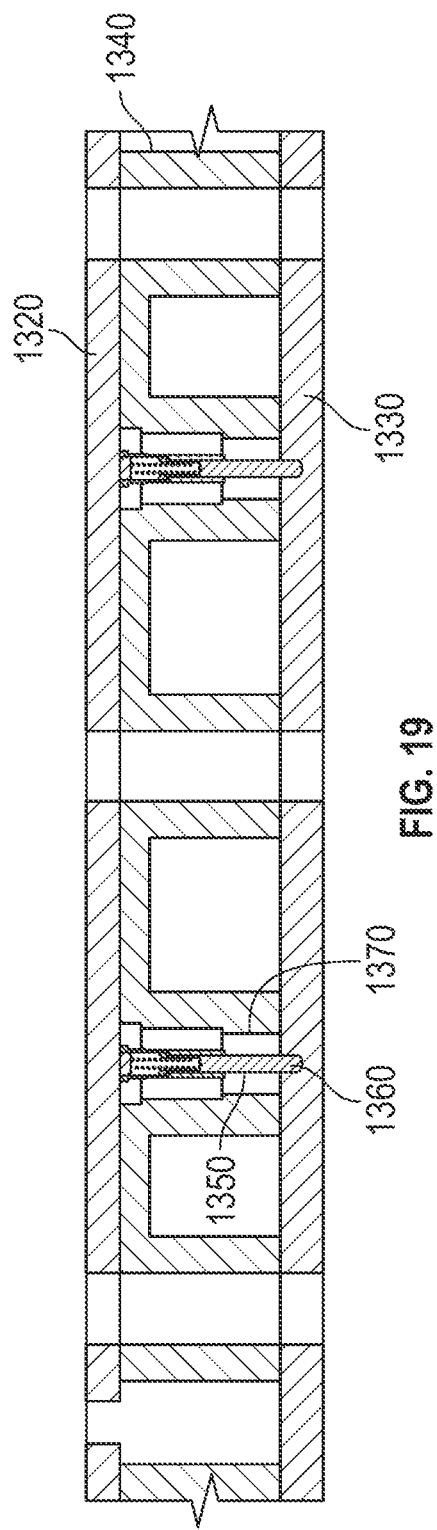

SPRING PIN RF COAXIAL INTERCONNECT

CROSS-REFERENCE TO RELATED APPLICATION

This application is a national stage application of International Application No. PCT/US2022/044387, filed on Sep. 22, 2022, which claims benefit of Provisional U.S. application 63/345,782 filed on May 25, 2022, and the contents of each are herein incorporated by reference.

FIELD OF THE INVENTION

This application relates to the field of communications and in particular, to coaxial connectors.

BACKGROUND

Radio Frequency (RF) coaxial connectors are widely used in wireless communication systems and wireless radio subsystems. Typical coaxial connection systems such as RF connection systems are cable-to-cable assemblies and comprise a plug and jack affixed to coaxial cables. Vendors that specialize in manufacturing RF coaxial connectors typically supply the connectors to wireless infrastructure vendors. Consequently, wireless infrastructure vendors must consider manufacturing and distribution lead times as well as cost of RF coaxial connectors in managing their supply chain.

In addition to cost and availability, wireless infrastructure vendors must consider the RF coaxial connector footprint and performance in their circuit design and layout. These issues are amplified in Multiple-Input-Multiple-Output (MIMO) radio and wireless communication systems which employ multiple antennas.

Further, in existing RF coaxial connection schemes, each connection requires a separate connection assembly (i.e., a separate cable for each connection).

Thus, the need exists for a RF coaxial connector or connection scheme that would minimize cost and space (footprint) while ensuring performance. There is a further need for such a connection scheme that allows for multiple such connections to be combined in a single assembly.

SUMMARY

Embodiments herein include a plug and jack connector assembly applicable for coaxial cables, circuit boards, or cable-to-board applications.

A coaxial plug generally has a construction of an inner contact pin mounted within a dielectric body, a front and rear conductive shell, and an outer conductor. A jack connector has a general construction to include an inner contact socket held within an outer conductive sleeve by way of a dielectric body.

A patch antenna is a type of low-profile antenna that can be mounted on a surface. In an embodiment a rectangular or square "patch" is mounted over a ground plane. Two metal sheets form a resonant piece of a microstrip transmission line with a length corresponding the wavelength of the transmitted/received radio waves, for example on-half the wavelength. Patch antennas are well suited for microwave frequencies where the wavelengths are short and the patches are relatively small.

Patch antennas may also be referred to as microstrip antennas and they can be printed directly onto a circuit board. Microstrip antennas may be fed by a microstrip transmission line. The patch antenna, microstrip transmission line and ground plane are made of high conductivity metal (typically copper). The patch is of length L, width W, and sitting on top of a substrate (some dielectric circuit board) of thickness h with permittivity $\varepsilon_r$. Typically, the thickness of the ground plane or of the microstrip is not critically important. Typically the height h is much smaller than the wavelength of operation, but should not be much smaller than 0.025 of a wavelength (1/40th of a wavelength) or the antenna efficiency will be degraded.

In a preferred embodiment a RF connector, for example a RF coaxial connector, is integral to a RF cover that is used to shield Power Amplifier/Low Noise Amplifier (PA-LNA) circuits and provide assembly datum for antenna patches.

An antenna patch assembly supports spring pins configured to electrically and mechanically couple to a Front End Module (FEM) RF cover. A FEM typically includes one or more PAs with input/output impedance matching, a switch, and one or more LNAs. The FEM is coupled with a Printed Circuit Board Assembly (PCBA).

The PCBA is designed to transmit electronic signals while dissipating heat generated by the electronic signals. Thus, the spring pin RF interconnect provides a novel approach to minimize the cost and space in RF design and layout while ensuring RF performance by minimizing signal loss through the connector assembly. The benefit becomes more noticeable in a MIMO design that includes multiple antenna patches, for example a 16 cross polarization (XPOL) antenna patch.

In some embodiments, a coaxial connection assembly is provided that includes a first spring pin fixed to a first component to be connected, such as an antenna which may be a patch antenna. The assembly also includes a first contact on a circuit board for connecting to the first component by way of the first spring pin. The assembly also includes a front end module (FEM) cover for spacing apart the first component and the circuit board.

The FEM cover defines a first channel through which the first spring pin extends. The FEM cover is formed from a conductive material, and the first channel contains a dielectric medium or substance.

In some embodiments, the coaxial connection assembly may include multiple coaxial connections. Accordingly, the assembly may include a second spring pin fixed to a second component to be connected, a second contact on the circuit board for connecting to the second component by way of the second spring pin, and a second channel defined within the FEM cover through which the second spring passes. The second channel contains the dielectric medium or substance.

In some embodiments, the dielectric medium or substance is air.

In some embodiments, the first spring pin comprises an outer sleeve and an inner pin nested and spring-loaded within the outer sleeve. The outer sleeve then has a first diameter and the inner pin has a second diameter smaller than the first diameter.

The first channel then has a first segment having a third diameter and second segment having a fourth diameter smaller than the third diameter.

When the first spring pin passes through the first channel, the first segment of the first channel encloses the outer sleeve and the second segment of the first channel encloses the inner pin.

In some such embodiments, the first segment and the second segment of the first channel are sized such that a cross-sectional area outside of the outer sleeve in the first segment is substantially similar to a cross-sectional area outside of the inner pin in the second segment.

In some embodiments, the first channel and the first spring pin are coaxial when assembled. In some such embodiments the FEM cover is not coaxial with the first channel or the first spring pin.

Where the first component is an antenna, such as a patch antenna, the circuit board may contain a front end module (FEM) for interfacing between the antenna and digital circuitry. The FEM cover then encloses the FEM when located on the circuit board.

In some such embodiments, the assembly further comprises a trace on the circuit board extending from the first contact to the FEM on the circuit board. The FEM cover then may include a mouse hole in the first channel adjacent the circuit board, such that when the FEM cover is located on the circuit board, the mouse hole encloses the trace and prevents contact between the FEM cover and the trace.

In some embodiments, the FEM cover has a chamber for enclosing the FEM. In such embodiments, the mouse hole may define a passage between the first channel and the chamber.

In some embodiments, the circuit board contains an internal trace instead of a surface based conduit. In such an embodiment, the internal trace may extend from the first contact to the FEM on an inner layer of the circuit board.

In some embodiments, the coaxial connection assembly includes a trace on the circuit board extending from the first contact, and the FEM cover comprises a mouse hole in the first channel adjacent the circuit board located such that when the FEM cover is located on the circuit board, the mouse hole encloses the trace and prevents contact between the FEM cover and the trace.

BRIEF DESCRIPTION OF THE DRAWINGS

FIG. 9 is a bottom perspective view of the front end module cover of FIG. 8.

FIG. 10 is a section view of the front end module cover of FIG. 8.

FIG. 18 is a section view of the front end module cover of FIG. 16.

FIG. 19 is a section view of the embodiment of FIG. 13.

DETAILED DESCRIPTION OF THE PREFERRED EMBODIMENTS

Figure 1:
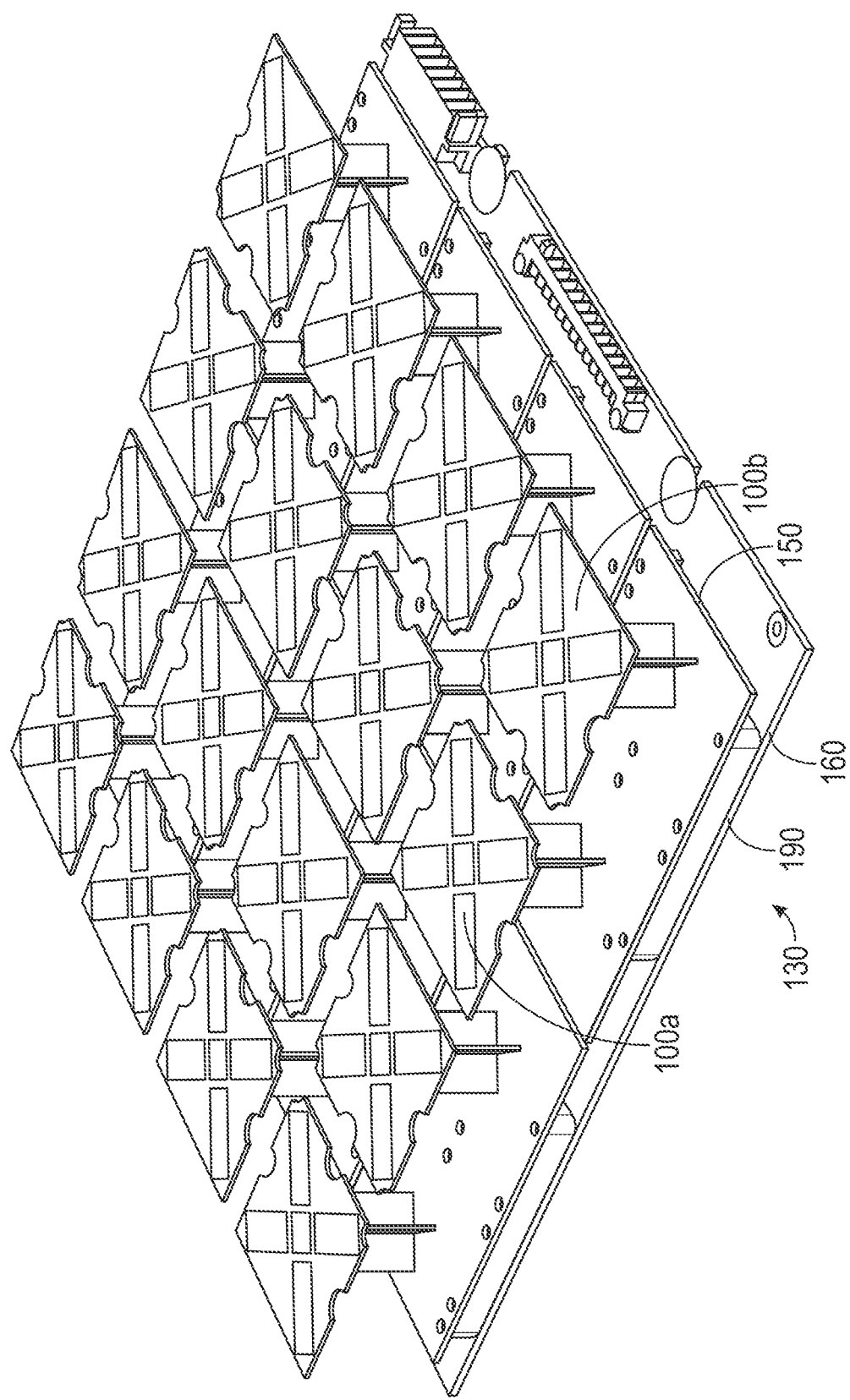
FIG. 1 is a perspective view of patch antennas connected to RF front end modules on a printed circuit board by way of coaxial connection assemblies in accordance with this disclosure.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the exemplified embodiments. Accordingly, the invention expressly should not be limited to such exemplary embodiments illustrating some possible non-limiting combination of features that may exist alone or in other combinations of features; the scope of the invention being defined by the claims appended hereto.

This disclosure describes the best mode or modes of practicing the invention as presently contemplated. This description is not intended to be understood in a limiting sense, but provides an example of the invention presented solely for illustrative purposes by reference to the accompanying drawings to advise one of ordinary skill in the art of the advantages and construction of the invention. In the various views of the drawings, like reference characters designate like or similar parts.

The embodiments shown provide coaxial connectors used in radio frequency (RF) assemblies. Such coaxial connectors connect antennas, such as patch antennas, to front end modules containing RF circuitry. Accordingly, in the context of the coaxial connection assemblies shown, the connection may be between an antenna, such as a patch antenna on a first circuit board, and front end module (FEM) circuitry on a second circuit board. Once the coaxial connector transmits a signal from the antenna to the second circuit board, the signal may be transported from a contact on the circuit board to the FEM by way of, for example, a microstrip transmission line or some other type of trace on a surface of or within the layers of the second circuit board.

It is noted that when referring to the components to be connected, or the patch antennas, those antennas are typically mounted on the first circuit board. In describing the assembly, the first circuit board and the corresponding patch antenna may be referred to interchangeably, since in the context of the assembly described herein, the purpose is to provide a coaxial connection between the antenna (or corresponding circuit board) and a second circuit board containing additional circuitry. The first circuit board may therefore be thought of as simply a conduit to direct the patch antenna, by way of a trace or a microstrip transmission line, to a designated location for the purpose of the coaxial connection described herein.

Figure 2:
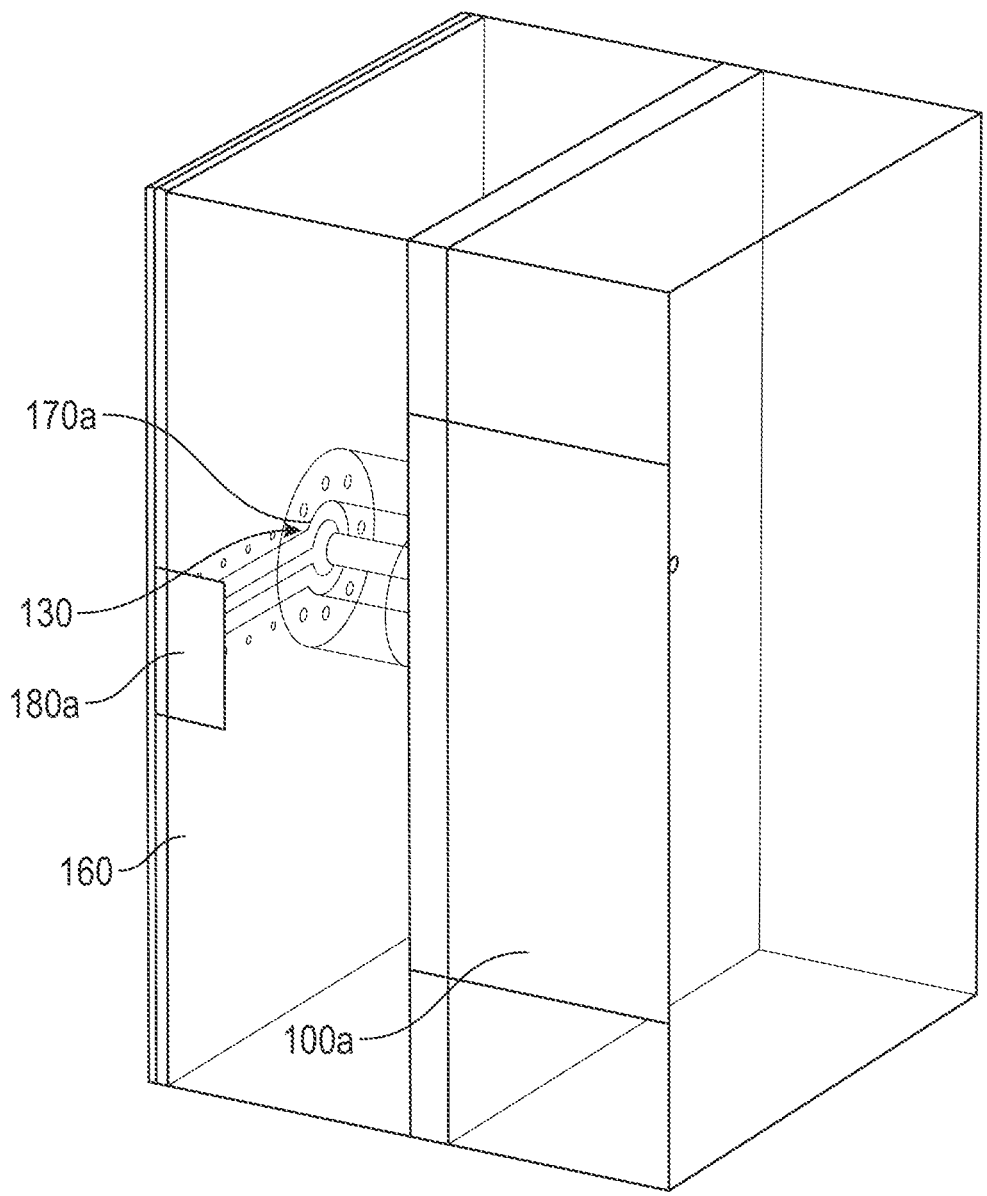
FIG. 2 is a schematic view of the connections contemplated herein.
Figure 3:
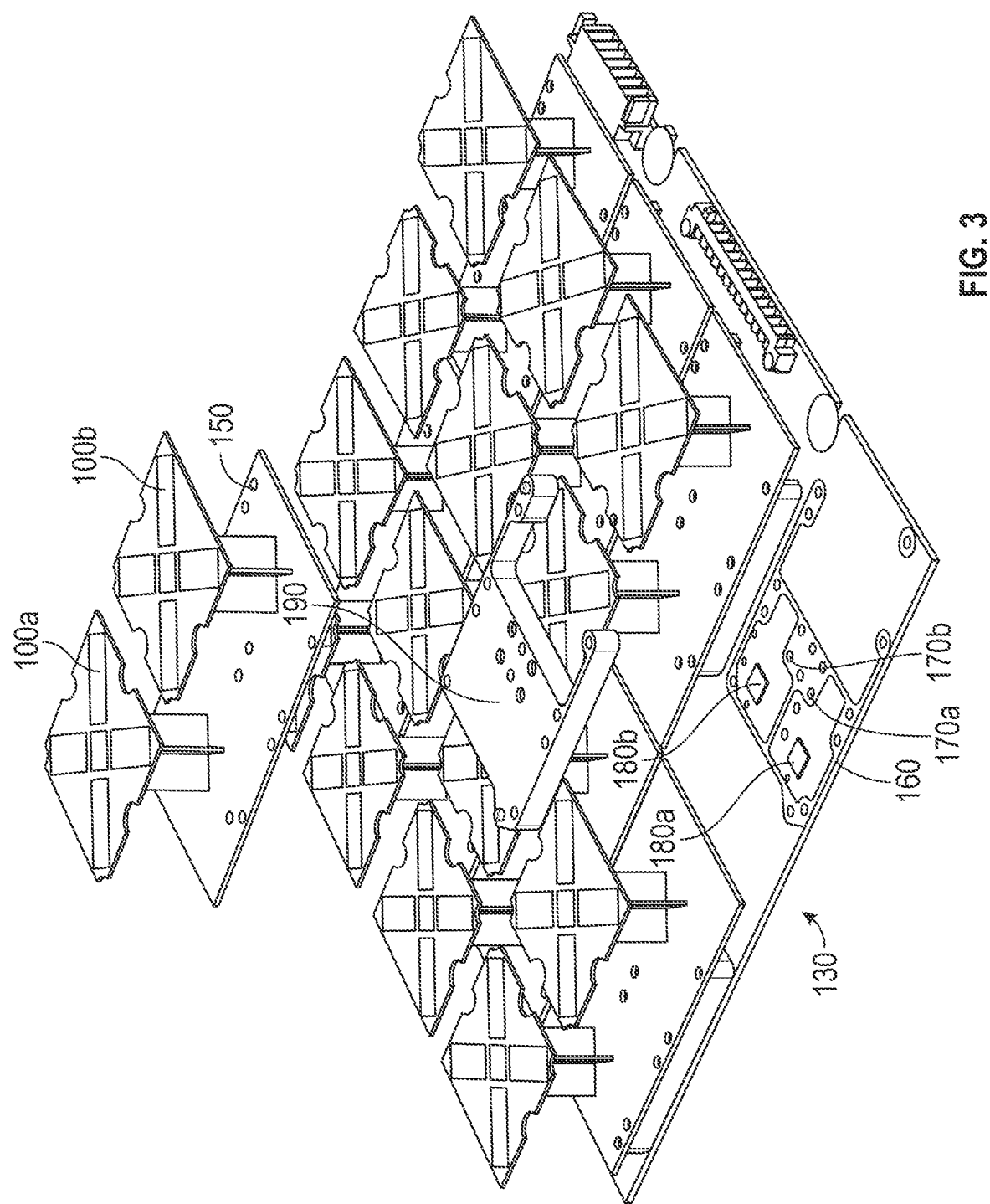
FIG. 3 is a partially exploded top perspective view of the embodiment of FIG. 1.
Figure 4:
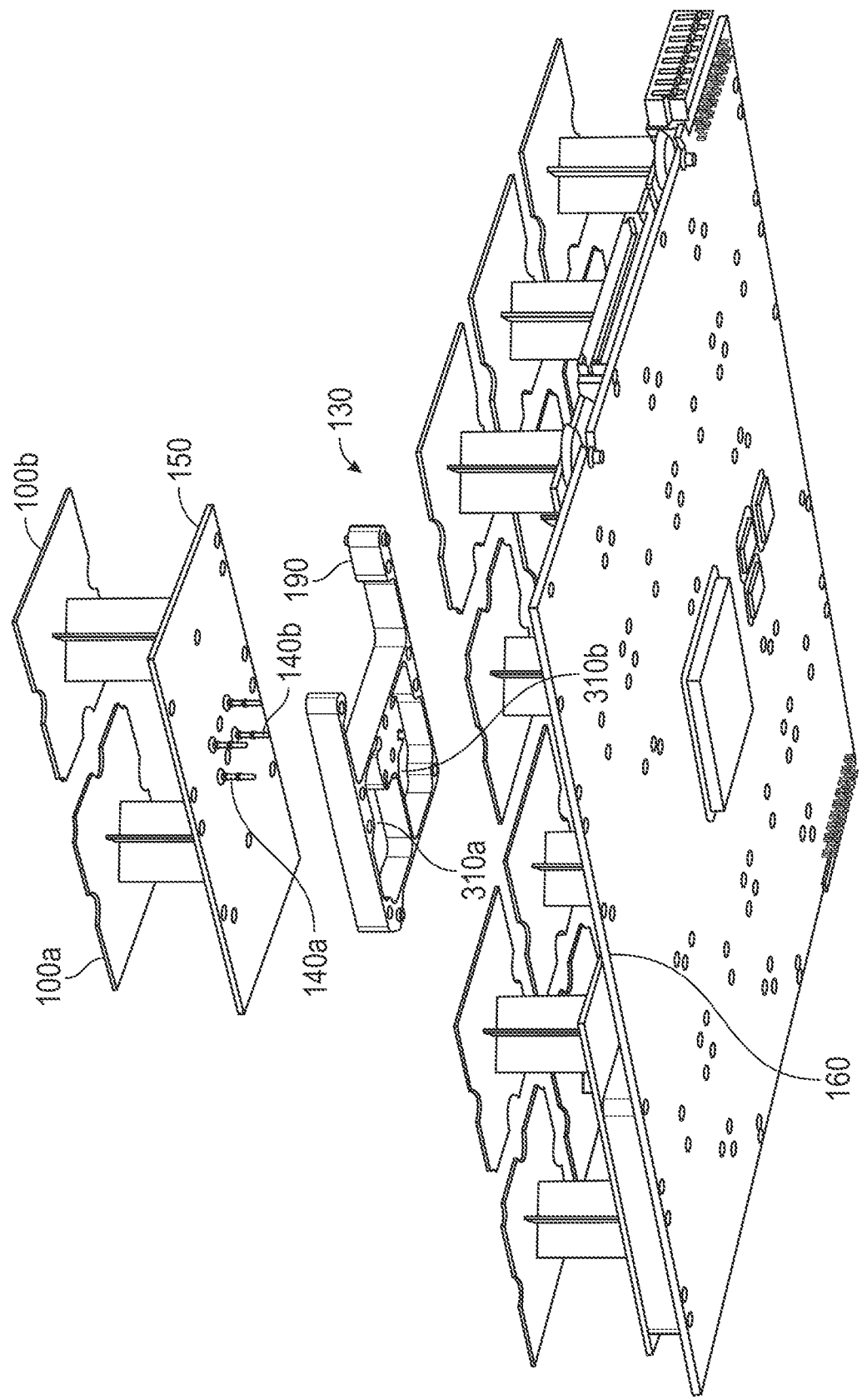
FIG. 4 is a partially exploded bottom perspective view of the embodiment of FIG. 1.
Figure 5:
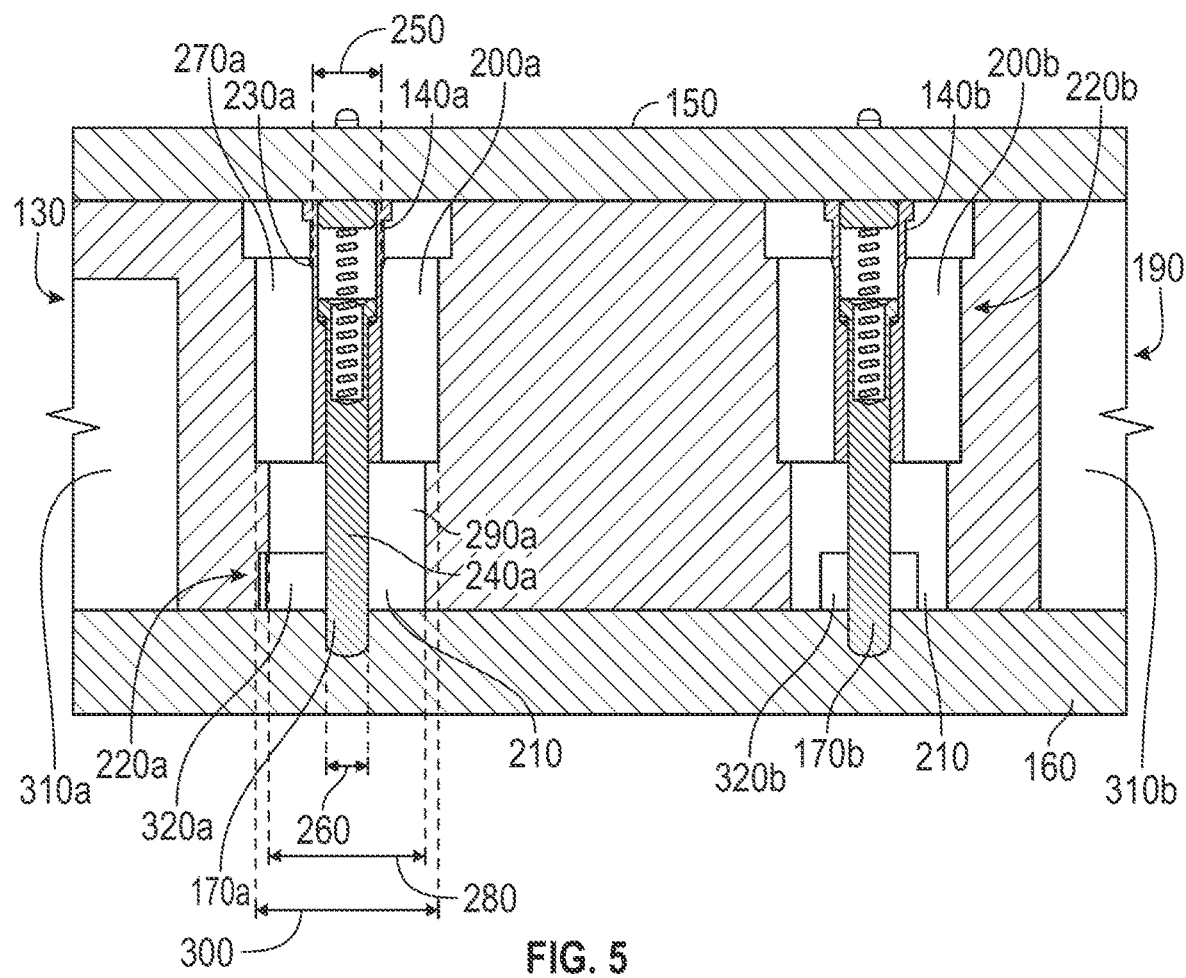
FIG. 5 is a section view of the embodiment of FIG. 1.

FIG. 1 is a perspective view of patch antennas 100a, b mounted on a first circuit board 150 and connected to RF front end modules on a second printed circuit board 160 by way of coaxial connection assemblies 130 in accordance with this disclosure. FIG. 2 is a schematic view of the connections contemplated herein. FIG. 3 is a partially exploded top perspective view of the embodiment of FIG. 1. FIG. 4 is a partially exploded bottom perspective view of the embodiment of FIG. 1. FIG. 5 is a section view of the embodiment of FIG. 1.

As shown, a coaxial connection assembly 130 is provided, that assembly including a first spring pin 140a fixed to a first component to be connected, in this case, a patch antenna 100a. The patch antenna 100a may be one of several such antennas mounted on a first circuit board 150. The patch antenna 100a may then be in electronic communication with the corresponding spring pin 140a, which may be by way of a trace in the first circuit board 150 or a microstrip transmission line on a surface of the circuit board.

A second circuit board 160 includes a first contact 170a for connecting to the first component by way of the first spring pin 140a. As such, when assembled, the first spring pin 140a connects to the first contact 170a.

The second circuit board 160 typically contains circuitry 180a for receiving and processing signals received by way of the first spring pin 140a. For example, where the first component is an antenna 100a, the circuitry 180a may be the front end module (FEM) discussed above for processing RF signals received from the antenna 100a.

The coaxial connection assembly also includes a front end module (FEM) cover 190 for spacing apart the first component 100, or the corresponding first circuit board 150, and the second circuit board 160. The FEM cover defines a first channel 200a through which the first spring pin 140a extends. Typically, when the first spring pin 140a extends through the first channel 200a, the channel and spring pin are coaxial.

Typically, the FEM cover 190 is formed from a conductive metal, and the first channel 200a contains a dielectric medium or substance 210. Accordingly, the combination of the spring pin 140a and the FEM cover function as a coaxial connection, with the substance 210 functioning as an appropriate dielectric. In the embodiment shown, the dielectric medium or substance 210 is air.

As shown, multiple spring pin assemblies 140a, b may utilize a single FEM cover 190 as part of a single coaxial connection assembly 130. As such, multiple patch antennas 100a, b may be provided on a single first circuit board 150, and each such antenna may be associated with a discrete spring pin 140a, b. The second component to be connected, in this case a second antenna 100b, may then be electronically connected to a second spring pin 140b. Both the first and second spring pin 140a, b may then be fixed to the first circuit board 150, and both antennas 100a, b may then be in electronic communication with the corresponding spring pins by way of respective traces or transmission lines.

A second contact 170b is then provided on the second circuit board 160 for connecting to the second component 100b by way of the second spring pin 140b.

A second channel 200b is then defined within the FEM cover 190 through which the second spring pin 140b passes. The second channel contains the dielectric medium or substance 210 which, as noted above, may be air. In this way, a single FEM cover 190 may function as the structure for multiple coaxial connections by providing multiple discrete channels 200a, b, each of which can support a discrete connection. As in the case of the first channel 200a and the first spring pin 140a, the second spring pin 140b is coaxial with the second channel 200b when the connection is assembled.

Accordingly, each combination of a single spring pin 140a and channel 200a may viewed as a different coaxial connection 220a, b in the context of the coaxial connection assembly 130.

It is noted that while the individual coaxial connections 220a, b each provide coaxial channels 200a, b and spring pins 140a, b, multiple such connections may be embedded in a single FEM cover 190. As such, the FEM cover 190 is typically not coaxial with the individual channels 200a, b or spring pins 140a, b.

For each coaxial connection 220a, as shown, the corresponding spring pin 140a typically comprises an outer sleeve 230a and an inner pin 240a within the outer sleeve. The inner pin 240a is nested and spring loaded in the outer sleeve 230a. Accordingly, the outer sleeve 230a has a first diameter 250 and the inner pin 240a has a second diameter 260 smaller than the first diameter.

The first channel 200a then has a first segment 270a having a third diameter 280 and a second segment 290a having a fourth diameter 300 smaller than the third diameter. As shown, when the first spring pin 140a passes through the first channel 200a, the first segment 270a of the first channel encloses the outer sleeve 230a and the second segment 290a encloses the inner pin 240a. The first segment 270a and the second segment 290a of the first channel 200a are then sized such that the cross-sectional area of the first segment outside of the outer sleeve 230a is substantially similar to the cross-sectional area of the second segment outside the inner pin 240a.

As noted above, when the first component 100a is a first patch antenna, the second circuit board 160 typically contains circuitry 180a, such as a front end module for interfacing between the corresponding patch antenna and digital circuitry, and the coaxial connection 220a simply transmits a signal from the component 100a to the corresponding circuitry 180a. This may be by way of a microstrip transmission line (not shown) on a surface of the second circuit board 160 extending from the first contact 170a to the circuitry 180a, or it may be by way of an internal trace within the second circuit board similarly extending from the first contact to the circuitry on an inner layer of the circuit board 160.

Accordingly, the FEM cover 190 typically has chambers 310a, b for enclosing the corresponding circuitry 180a, b for each connection 220a, b. The chambers 310a, b then enclose the front end modules or other circuitry 180a, b when the FEM cover 190 is located on the second circuit board 160.

Because the channels 200a, b define coaxial connections 220a, b, each such connection must be kept separate from the chambers 310a, b enclosing the corresponding circuitry 180a, b. Accordingly, the FEM cover 190 may comprise a mouse hole 320a, b in each channel 200a, b located adjacent the second circuit board 160 in embodiments in which a surface trace is used to transmit a signal from the coaxial connection 220a to the corresponding circuitry 180a. When assembled, the mouse hole 320a, b in each channel 200a, b extends from the channel to the corresponding chamber 310a, b and is located to enclose the corresponding trace and thereby prevent contact between the FEM cover 190 and the trace.

As such, the mouse hole 320a, b in each channel 200a, b defines a passage between the corresponding channel and the corresponding chamber 310a, b for enclosing the corresponding circuitry 180a, b.

Figure 6:
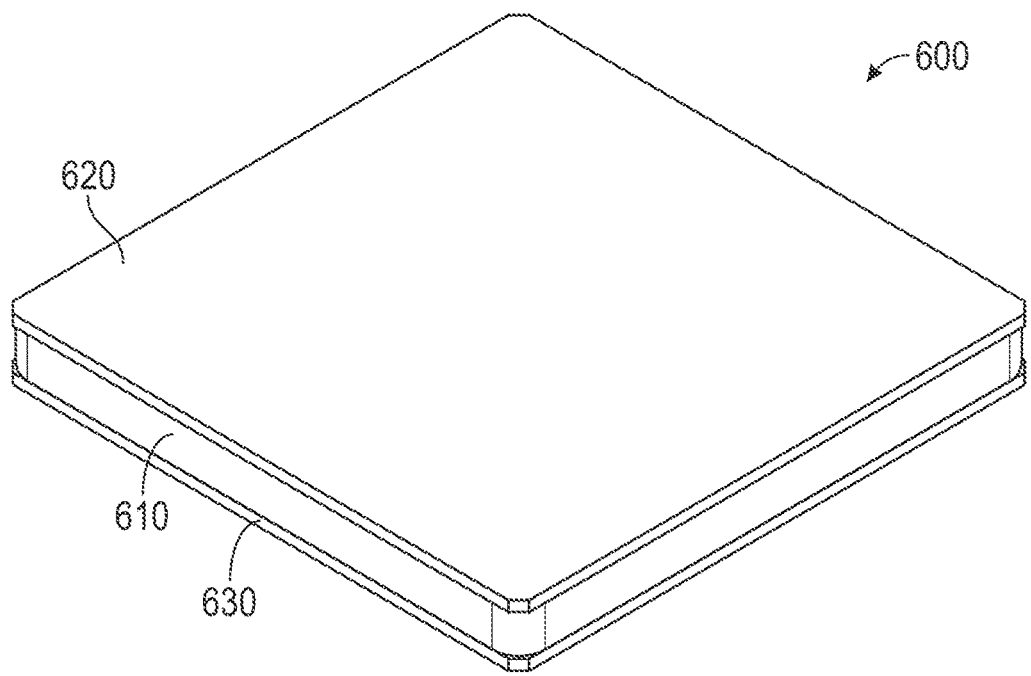
FIG. 6 is a perspective view of a second embodiment of a coaxial connection assembly in accordance with this disclosure.
Figure 7:
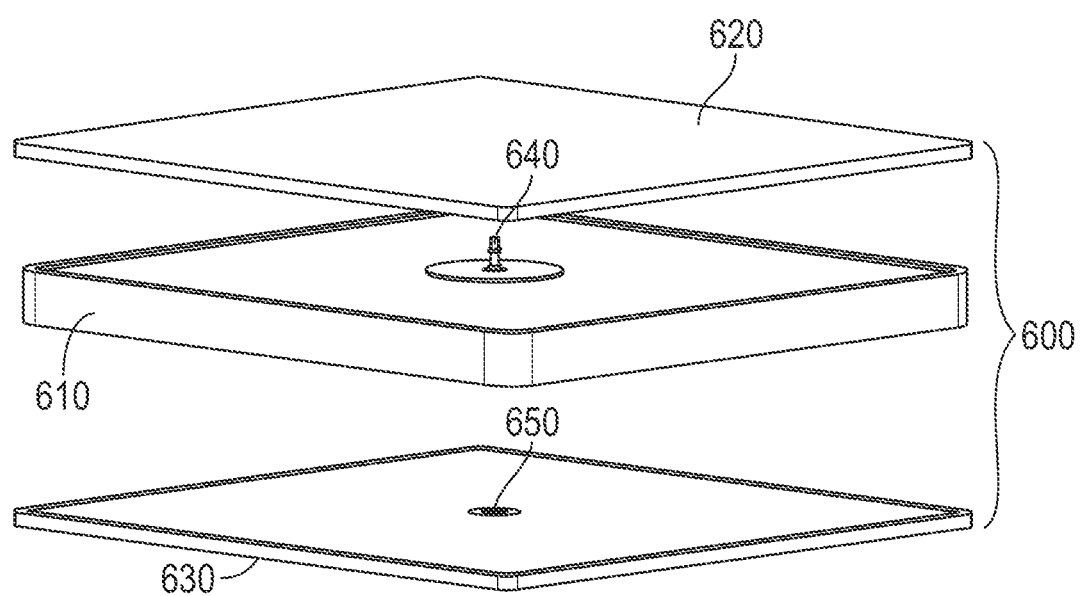
FIG. 7 is an exploded view of the embodiment of FIG. 6.
Figure 8:
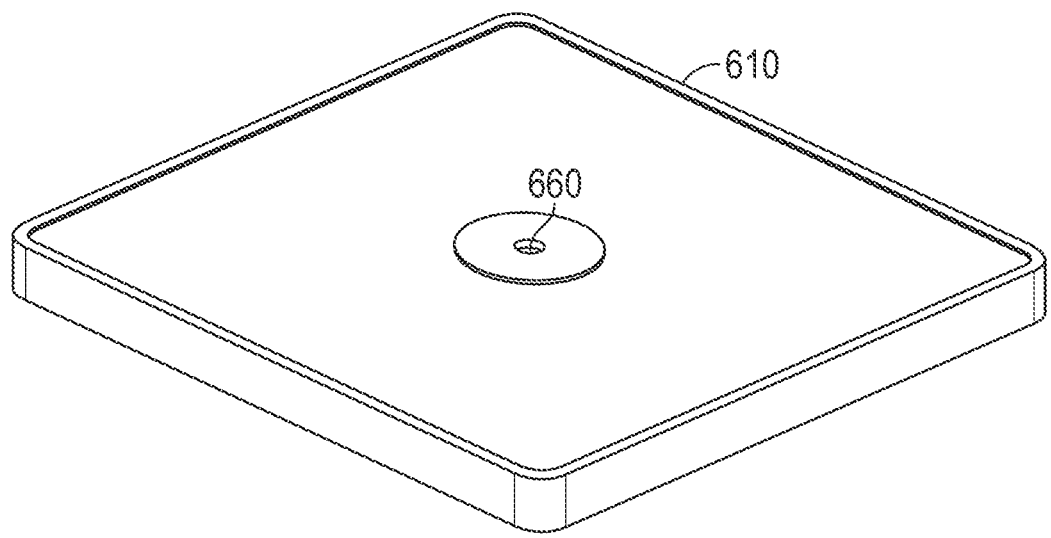
FIG. 8 is a top perspective view of the front end module cover of the embodiment of FIG. 6.
Figure 11:
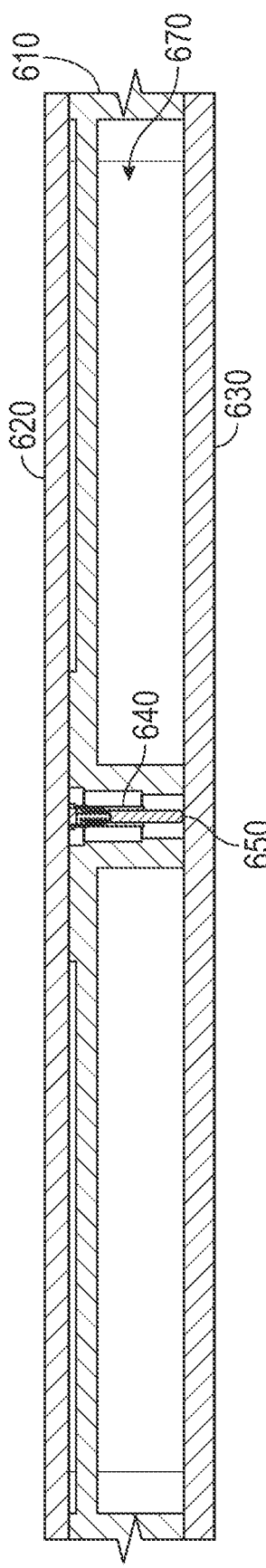
FIG. 11 is a section view of the embodiment of FIG. 6.

FIG. 6 is a perspective view of a second embodiment of a coaxial connection assembly 600 in accordance with this disclosure. FIG. 7 is an exploded view of the embodiment of FIG. 6. FIG. 8 is a top perspective view of the front end module cover 610 of the embodiment of FIG. 6. FIG. 9 is a bottom perspective view of the front end module cover 610 of FIG. 8. FIG. 10 is a section view of the front end module cover 610 of FIG. 8. FIG. 11 is a section view of the embodiment of FIG. 6.

As discussed above, the assembly 600 shown is a coaxial assembly for connecting a first component, such as an antenna, often mounted on a first circuit board 620, to a second circuit board 630. The embodiment shown is simplified, and as such, shows a single spring pin 640 fixed to the first circuit board 620, as well as a contact patch 650 on the second circuit board 630. When assembled, the spring pin 640 connects to the contact patch 650 and transmits a signal from an antenna mounted on the first circuit board to circuitry, such as an RF front end module, on the second circuit board 630.

In many respects, the second embodiment is similar to the first embodiment, and as such, the FEM cover 610 shown is formed from a conductive material and comprises a channel 660, and the spring pin 640 extends within the channel. The FEM cover 610 may then include a chamber 670 discrete from the channel 660 for enclosing whatever electronics are to be provided.

As discussed above with respect to the first embodiment, the spring pin 640 typically includes an outer sleeve and an inner pin, each having different diameters. Similarly, the channel 660 contains two discrete segments having different diameters and sized to provide substantially similar cross-sectional areas outside of the corresponding outer sleeve or inner pin of the spring pin 640.

As noted above, the channel contains a dielectric material 680, such as air, which fills the cross-sectional areas between the outer diameters of the channel 660 and the spring pin 640 contained therein.

Figure 12:
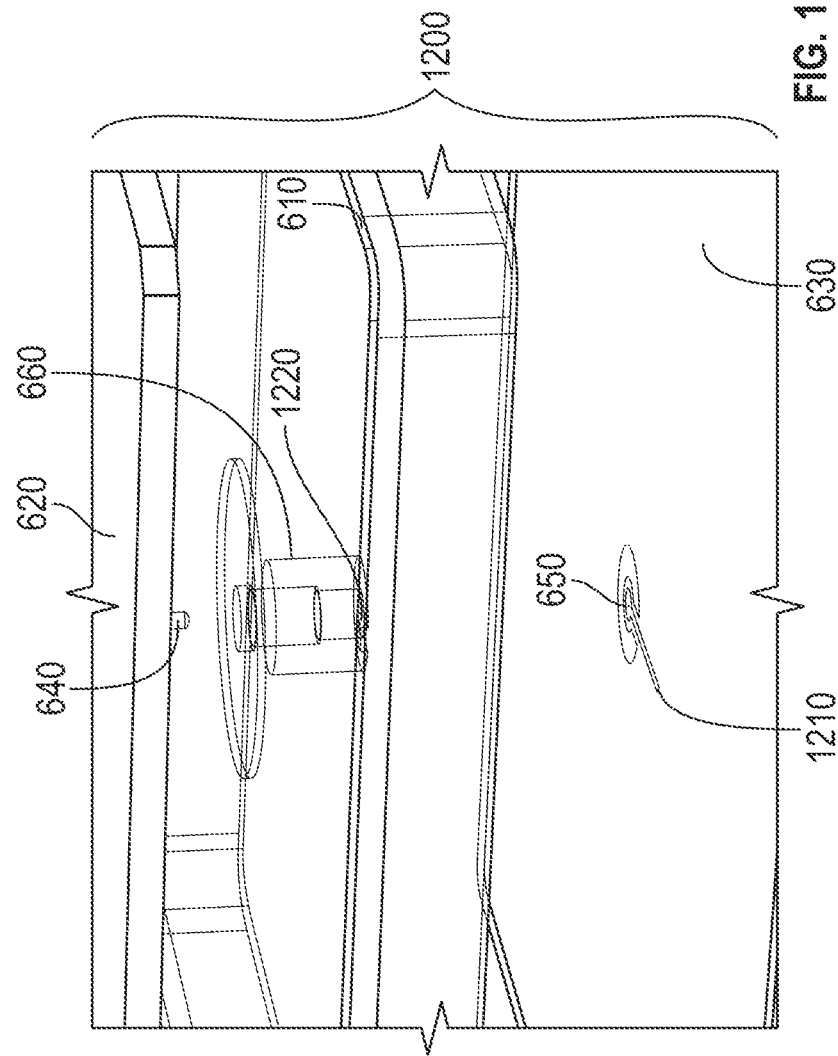
FIG. 12 is an exploded view of a third embodiment of a coaxial connection assembly in accordance with this disclosure.

FIG. 12 is an exploded view of a third embodiment of a coaxial connection assembly 1200 in accordance with this disclosure. The embodiment shown in FIG. 12 is similar to the assembly 600 discussed above with respect to FIG. 6, and as such, only distinctions are discussed herein. Otherwise, reference numerals correspond to those discussed above with respect to the assembly 600 of FIG. 6.

As shown, and as discussed above, in some embodiments, a microstrip transmission line 1210 may be provided to transmit a signal from a contact patch 650 on the second circuit board 630 to circuitry located elsewhere on the second circuit board. The circuitry is typically located such that it resides in the chamber 670 of the FEM cover 610 when the coaxial connection assembly 1200 is fully assembled.

Accordingly, the FEM cover 610 is provided with a mouse hole 1220 at the base of the channel 660. When assembled, the mouse hole 1220 is located adjacent the second circuit board 630 and encloses the corresponding surface trace, such as the microstrip transmission line 1210 shown, such that the conductive material of the FEM cover 610 does not contact the transmission line.

Figure 13:
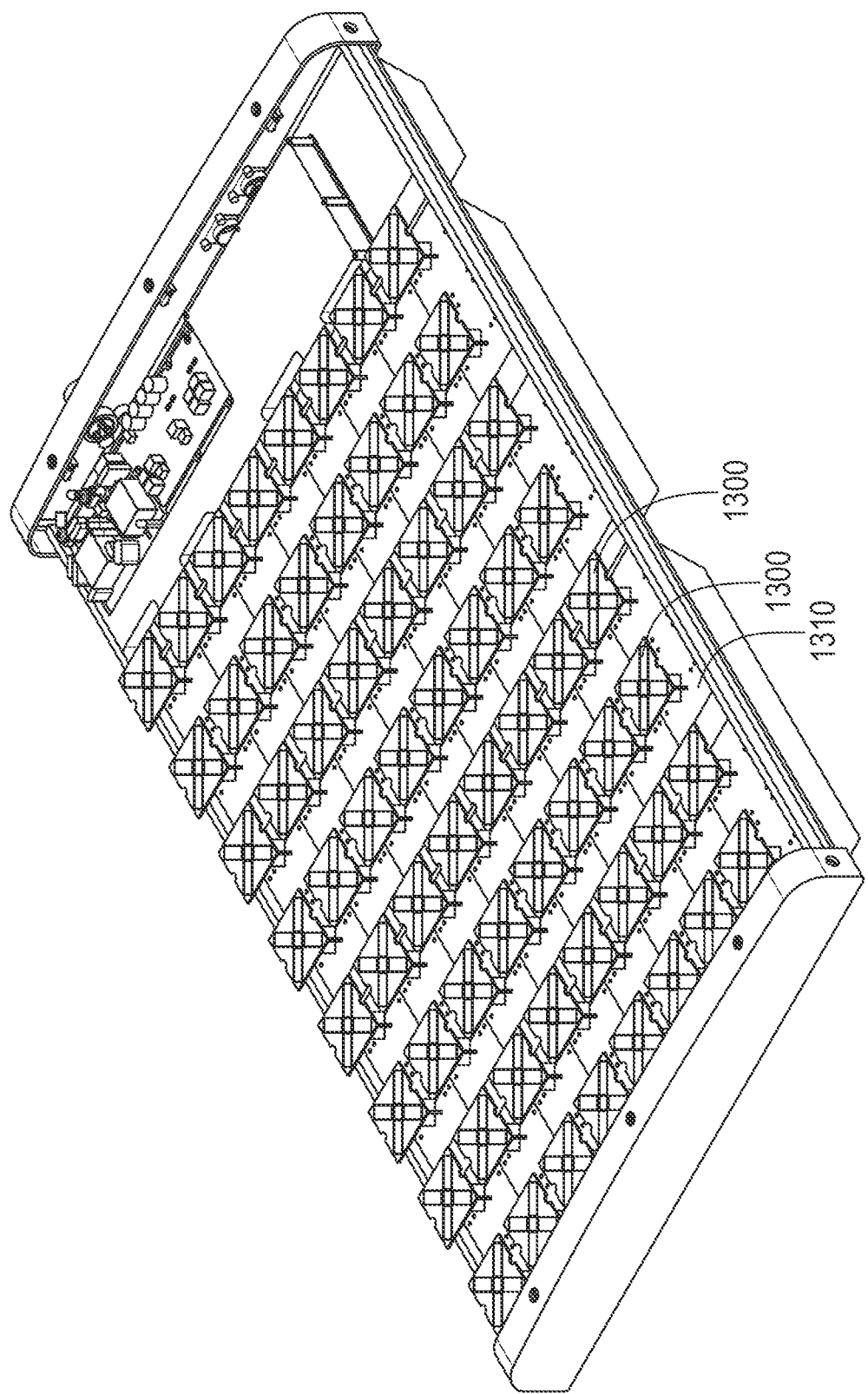
FIG. 13 is a perspective view of a fourth embodiment of patch antennas connected to RF front end modules on a printed circuit board by way of coaxial connection assemblies in accordance with this disclosure.
Figure 14:
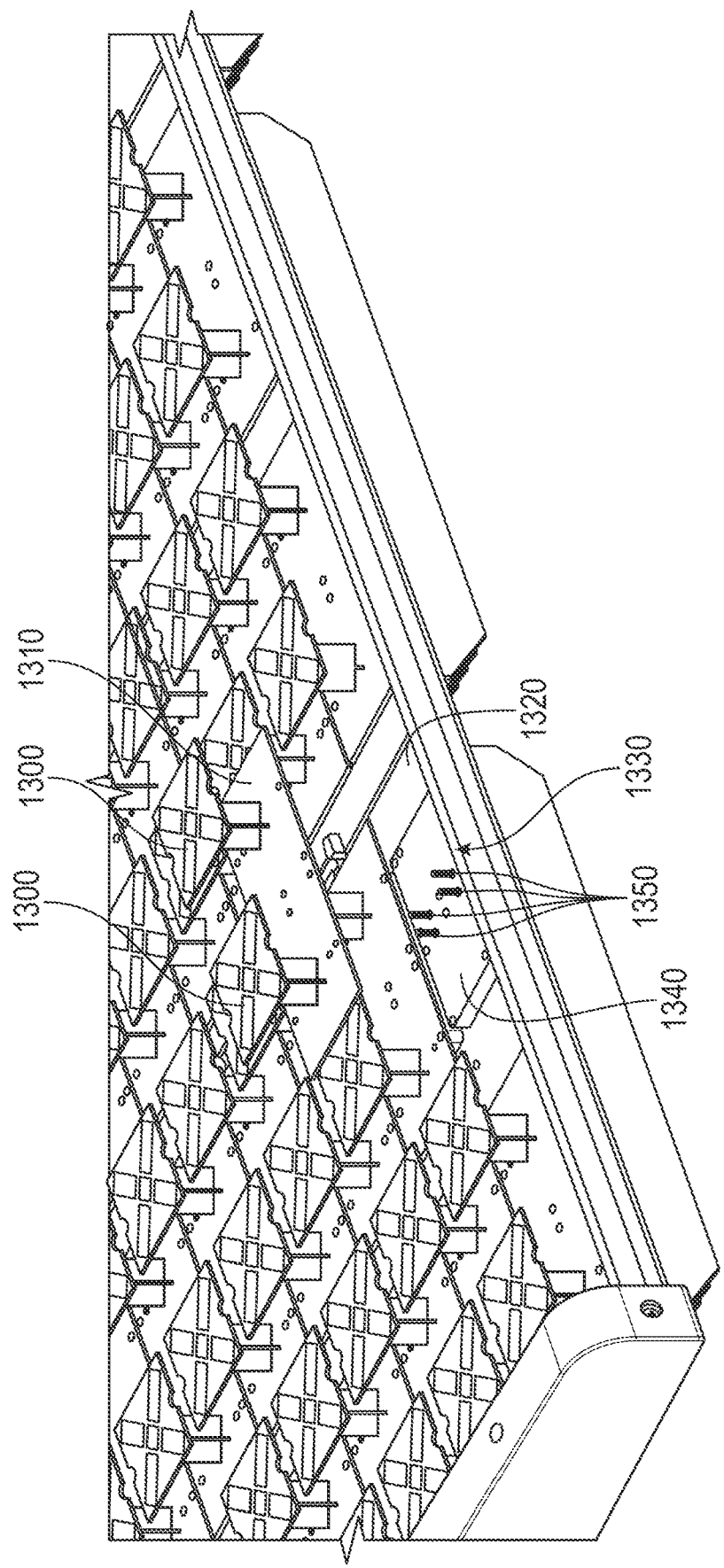
FIG. 14 is a partially exploded top perspective view of the embodiment of FIG. 13.
Figure 15:
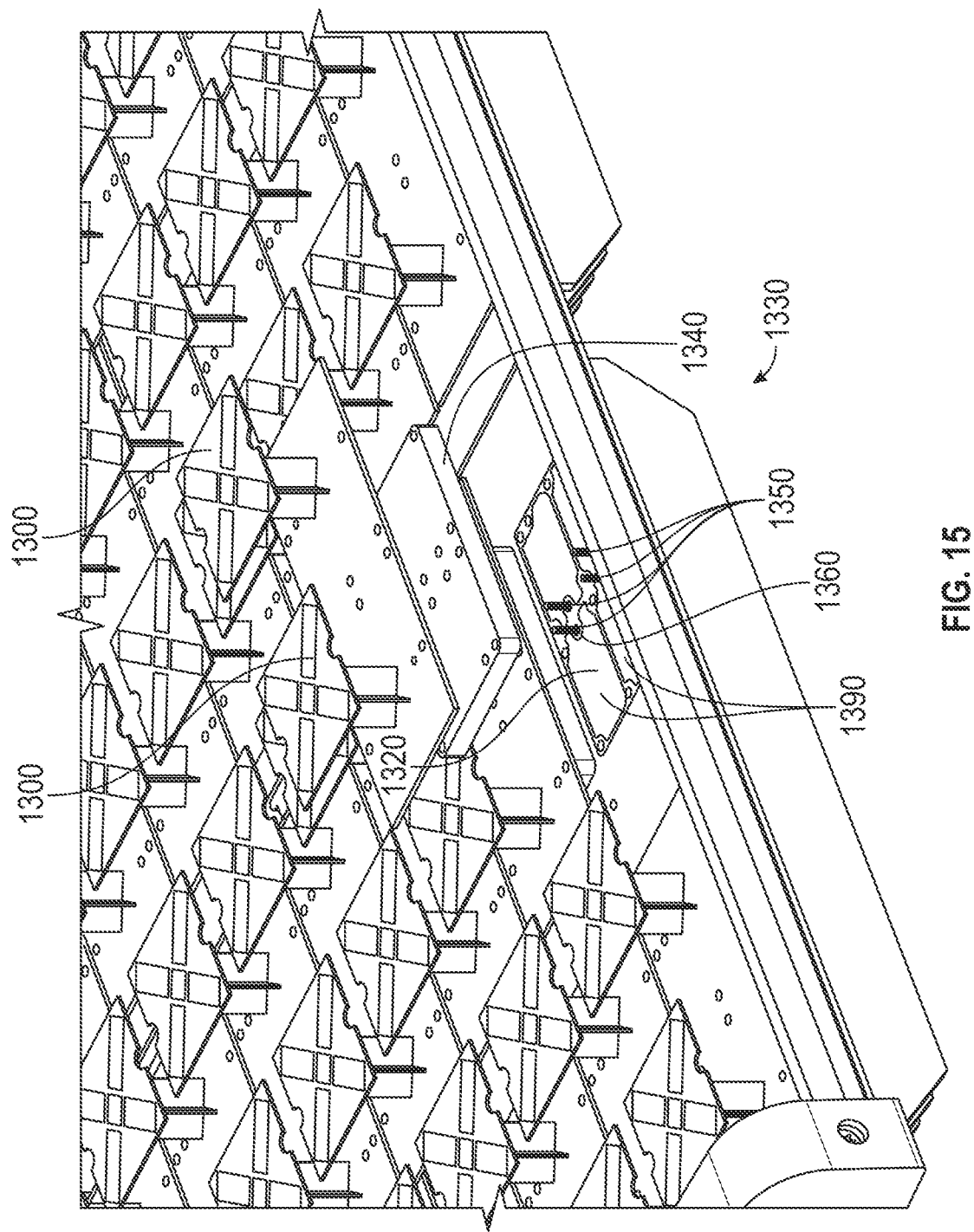
FIG. 15 is a further exploded top perspective view of the embodiment of FIG. 13.
Figure 16:
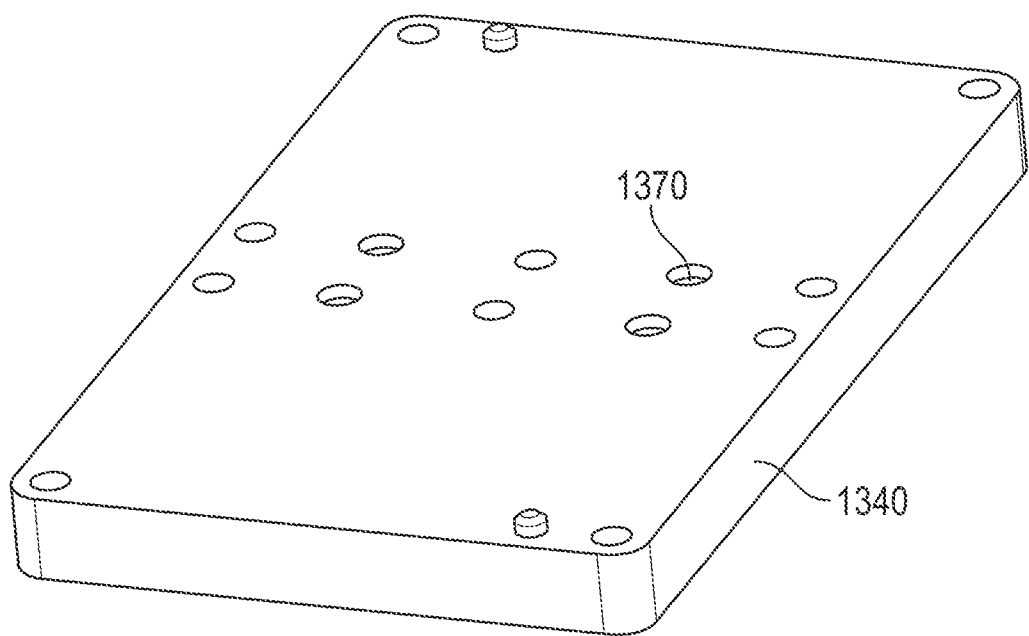
FIG. 16 is a top perspective view of a front end module cover of the embodiment of FIG. 13.
Figure 17:
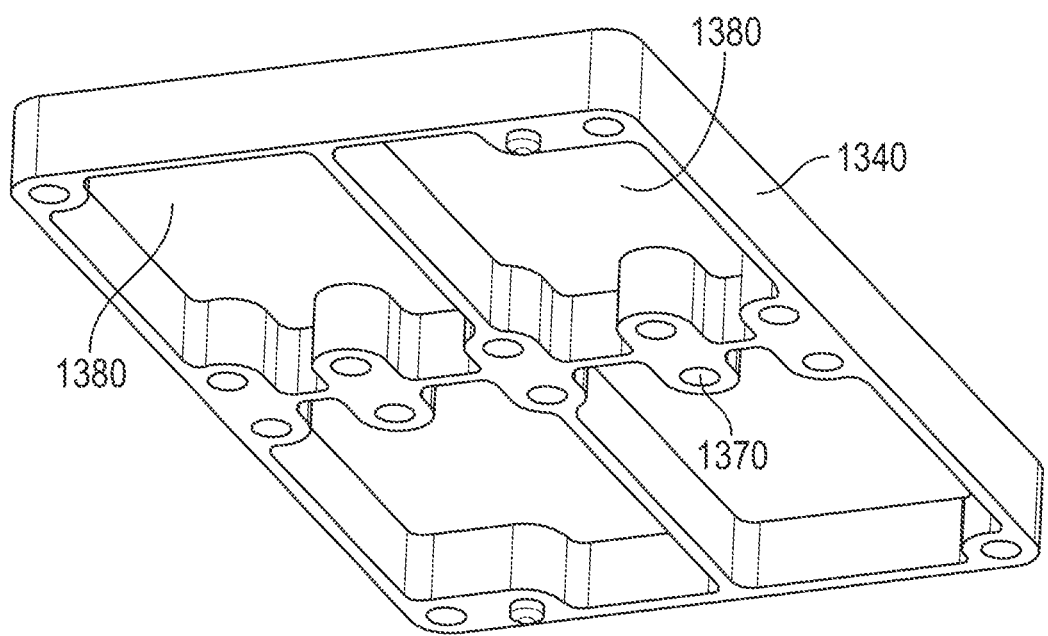
FIG. 17 is a bottom perspective view of the front end module cover of FIG. 16.

FIG. 13 is a perspective view of a fourth embodiment of patch antennas 1300 on first circuit boards 1310 connected to RF front end modules on a second printed circuit board 1320 by way of coaxial connection assemblies 1330 in accordance with this disclosure. FIG. 14 is a partially exploded top perspective view of the embodiment of FIG. 13. FIG. 15 is a further exploded top perspective view of the embodiment of FIG. 13. FIG. 16 is a top perspective view of a front end module cover 1340 of the embodiment of FIG. 13. FIG. 17 is a bottom perspective view of the front end module cover 1340 of FIG. 16. FIG. 18 is a section view of the front end module cover 1340 of FIG. 16. FIG. 19 is a section view of the embodiment of FIG. 13.

In many respects, the assemblies 1330 of FIG. 13 are similar to the assemblies 130 discussed above with respect to FIG. 1. Accordingly, the patch antennas 1300 may be multiple such antennas mounted on a single first circuit board 1310, and a single second circuit board 1320 may support many such assemblies, with each antenna being provided with discrete circuitry or chambers for circuitry. Each antenna 1330 is then in communication with a corresponding spring pin 1350.

The second circuit board 1320 then contains a contact 1360 for each spring pin 1350 in order to receive the signal from the corresponding antenna 1330. The signal is then transmitted from the contact 1360 to corresponding circuitry located elsewhere on the second circuit board 1320 (not shown). Such transmission may be by way of an internal trace or a surface based microstrip transmission line, as discussed above.

The FEM cover 1340 defines channels 1370 through which the spring pins 1350 extend when the assembly 1330 is fully assembled. When assembled, the spring pins 1350 are coaxial with the corresponding channel 1370 in the FEM cover 1350. The FEM cover further defines chambers 1380 for enclosing segments 1390 of the second circuit board 1320, each designated for containing circuitry, such as an RF front end module, corresponding to each spring pin 1350.

In all respects not discussed herein, such as with respect to the form of the spring pins 1350 and the corresponding diameters of segments of the channels 1370, the assemblies 1330 of FIG. 13 are similar to those discussed above with respect to FIG. 1.

While the present invention has been described at some length and with some particularity with respect to the several described embodiments, it is not intended that it should be limited to any such particulars or embodiments or any particular embodiment, but it is to be construed with references to the appended claims so as to provide the broadest possible interpretation of such claims in view of the prior art and, therefore, to effectively encompass the intended scope of the invention. Furthermore, the foregoing describes the invention in terms of embodiments foreseen by the inventor for which an enabling description was available, notwithstanding that insubstantial modifications of the invention, not presently foreseen, may nonetheless represent equivalents thereto.

What is claimed is:
1. A coaxial connection assembly comprising:
   a first spring pin fixed to a first component to be connected, the first component being a patch antenna;
   a first contact on a circuit board for connecting to the first component by way of the first spring pin; and a front end module cover for spacing apart the first component and the circuit board, the front end module cover defining a first channel through which the first spring pin extends;

wherein the front end module cover is formed from a conductive material, and wherein the first channel contains a dielectric medium or substance.

2. The coaxial connection assembly of claim 1 further comprising:

a second spring pin fixed to a second component to be connected;

a second contact on the circuit board for connecting to the second component by way of the second spring pin;

a second channel defined within the front end module cover through which the second spring pin passes, wherein the second channel contains the dielectric medium or substance.

3. The coaxial connection assembly of claim 1 wherein the dielectric medium or substance is air.

4. The coaxial connection assembly of claim 1 wherein the circuit board contains a front end module for interfacing between the first patch antenna and digital circuitry, and wherein the front end module cover encloses the front end module when located on the circuit board.

5. The coaxial connection assembly of claim 4 further comprising a trace on the circuit board extending from the first contact to the front end module on the circuit board, wherein the front end module cover comprises a mouse hole in the first channel adjacent the circuit board located such that when the front end module cover is located on the circuit board, the mouse hole encloses the trace and prevents contact between the front end module cover and the trace.

6. The coaxial connection assembly of claim 5 wherein the mouse hole defines a passage between the first channel and a chamber in the front end module cover for enclosing the front end module.

7. The coaxial connection assembly of claim 4 wherein the circuit board contains an internal trace extending from the first contact to the front end module on an inner layer of the circuit board.

8. The coaxial connection assembly of claim 1 further comprising a trace on the circuit board extending from the first contact, wherein the front end module cover comprises a mouse hole in the first channel adjacent the circuit board located such that when the front end module cover is located on the circuit board, the mouse hole encloses the trace and prevents contact between the front end module cover and the trace.

9. A coaxial connection assembly comprising:

a first spring pin fixed to a first component to be connected;

a first contact on a circuit board for connecting to the first component by way of the first spring pin; and a front end module cover for spacing apart the first component and the circuit board, the front end module cover defining a first channel through which the first spring pin extends;

wherein the front end module cover is formed from a conductive material, and wherein the first channel contains a dielectric medium or substance;

wherein the first spring pin comprises an outer sleeve and an inner pin nested and spring-loaded within the outer sleeve, wherein the outer sleeve has a first diameter and the inner pin has a second diameter smaller than the first diameter;

wherein the first channel has a first segment having a third diameter and a second segment having a fourth diameter smaller than the third diameter, and wherein when the first spring pin passes through the first channel, the first segment of the first channel encloses the outer sleeve, and the second segment of the first channel encloses the inner pin.

10. The coaxial connection assembly of claim 9 wherein the first segment and the second segment of the first channel are sized such that a cross-sectional area outside of the outer sleeve in the first segment is substantially similar to a cross-sectional area outside of the inner pin in the second segment.

11. A coaxial connection assembly comprising:

a first spring pin fixed to a first component to be connected;

a first contact on a circuit board for connecting to the first component by way of the first spring pin; and a front end module cover for spacing apart the first component and the circuit board, the front end module cover defining a first channel through which the first spring pin extends;

wherein the front end module cover is formed from a conductive material, and wherein the first channel contains a dielectric medium or substance;

wherein the first channel and the first spring pin are coaxial, and wherein the front end module cover is not coaxial with the first channel or the first spring pin.

* * * * *